(12) United States Patent
Suehira et al.

(10) Patent No.: US 7,531,821 B2
(45) Date of Patent: May 12, 2009

(54) IMPRINT APPARATUS AND IMPRINT METHOD INCLUDING DUAL MOVABLE IMAGE PICK-UP DEVICE

(75) Inventors: Nobuhito Suehira, Kawasaki (JP); Junichi Seki, Yokohama (JP); Hideki Ina, Tokyo (JP); Koichi Sentoku, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 82 days.

(21) Appl. No.: 11/851,006

(22) Filed: Sep. 6, 2007

(65) Prior Publication Data
US 2008/0073604 A1    Mar. 27, 2008

(30) Foreign Application Priority Data
Sep. 22, 2006 (JP) .............................. 2006-257713
Aug. 8, 2007 (JP) .............................. 2007-206093

(51) Int. Cl.
G01N 21/86 (2006.01)
(52) U.S. Cl. ..................................... 250/559.3; 250/548
(58) Field of Classification Search .............. 250/559.2, 250/559.3, 559.44, 221, 548; 356/399–401; 355/53, 55; 219/121.71–121.83
See application file for complete search history.

(56) References Cited

U.S. PATENT DOCUMENTS 5,811,754 A * 9/1998 Nakatani et al. ....... 219/121.83
6,529,625 B2    3/2003 Sentoku et al.
6,696,220 B2    2/2004 Bailey et al.
2007/0187875 A1  8/2007 Terasaki et al.

OTHER PUBLICATIONS

Stephan Y. Chou et. al., "Imprint of Sub-25 nm Vias and Trenches in Polymers," 67 Appl. Phys. Lett. 3114-16 (1995).

* cited by examiner

Primary Examiner—Que T Le
(74) Attorney, Agent, or Firm—Fitzpatrick, Cella, Harper & Scinto

(57) ABSTRACT

An imprint apparatus, comprising a first holder for holding a mold having an imprint pattern; a second holder for holding a workpiece to which the imprint pattern is transferred; a first illumination system for irradiating a mark for determining a position of the mold and a mark for determining a position of the workpiece with light; a first and second optical systems for imaging the marks for the mold and workpiece at a first and second observation points respectively; an imaging optical system; a first and second image pick-up devices for observing the marks for the mold and workpiece respectively; and at least one of a first drive mechanism for moving the first image pick-up device while following movement of the first observation point and a second drive mechanism for moving the second image pick-up device while following movement of the second observation point.

21 Claims, 7 Drawing Sheets

IMPRINT APPARATUS AND IMPRINT METHOD INCLUDING DUAL MOVABLE IMAGE PICK-UP DEVICE

BACKGROUND OF THE INVENTION

1. Field of the Invention

The present invention relates to an imprint apparatus and an imprint method which are used for transferring a mold shape to a workpiece.

2. Description of the Related Art

In recent years, as described in "Stephan Y. Chou et. al., Appl. Phys. Lett, 67, 3114, 1995", a fine processing technique for pressurizing and transferring a fine structure provided on a mold to a work such as a semiconductor, a glass, a resin, or a metal has been developed and attracted attention.

This technique is called nanoimprinting or nanoembossing because its resolution is on the order of several nanometers. According to this technique, a three-dimensional structure can be collectively processed at a wafer level at once. Therefore, thetechnique is expected to be applicable in a wide variety of fields in addition to manufacturing semiconductors.

For example, the technique is expected to be applied to manufacturing techniques for an optical device such as a photonic crystal, a micro total analysis system (µ-TAS), and a biochip.

An example will be described in which an optical imprint method is used for a semiconductor manufacturing technique.

First, a resin layer made of a photocurable resin is formed on a workpiece (for example, a semiconductor wafer).

Next, a mold on which a desirable depressed and projected structure is formed is pressed against the resin layer and pressurized thereagainst.

The resin layer is irradiated with ultraviolet light to cure the photocurable resin, thereby transferring the structure to the resin layer. Etching is performed using the resin layer as a mask, so that the structure is transferred to the workpiece.

In such semiconductor manufacturing process, it is necessary to align the mold and the workpiece.

For example, in the current circumstances in which a semiconductor process rule is 100 nm or less, it is said that an allowable range of an alignment error attributable to an apparatus is several nm to several tens nm.

A method of aligning a mold with a workpiece based on the fact that the focus length is changed according to the wavelength of light is disclosed in U.S. Pat. No. 6,696,220. To be specific, a mark provided on the surface of a mold is imaged to an image pick-up device at a first wavelength and a mark on the surface of a workpiece is imaged to the image pick-up device at a second wavelength different from the first wavelength. The two wavelengths are selected according to a gap formed between the mold and the workpiece.

In the case of the first wavelength, although focus is achieved on the mark provided on the surface of the mold, focus is not achieved on the mark provided on the surface of the workpiece. In contrast to this, in the case of the second wavelength, although focus is not achieved on the mark provided on the surface of the mold, focus is achieved on the mark provided on the surface of the workpiece.

An image of the mark provided on the surface of the workpiece, on which focus is not achieved at the first wavelength, is measured. Similarly, an image of the mark provided on the surface of the mold, on which focus is not achieved at the second wavelength, is measured. The measured images are removed by image processing. After that, an image of the mark provided on the surface of the mold, on which focus is achieved at the first wavelength, is measured. Similarly, an image of the mark provided on the surface of the workpiece, on which focus is achieved at the second wavelength, is measured. The measured images are combined with each other on a single imaging plane.

A method of aligning a mask with a wafer in a semiconductor exposure apparatus is further disclosed in U.S. Pat. No. 6,529,625.

To be specific, when the relative position between the mask serving as a first object and the wafer serving as a second object is to be detected, a third object on which a reference alignment mark different from marks for determining positions on the respective objects is located is provided. An optical image of the mark located on the third object and optical images of the marks located on the first and second objects are detected by an image pick-up device to detect position shifts of the first and second objects. In the apparatus, an image pick-up device for imaging the mark located on the first object is different from an image pick-up device for imaging the mark located on the second object and a part of optical systems thereof is commonly used.

The prior art method of aligning the mold with the workpiece as described in U.S. Pat. No. 6,696,220 employs a structure in which different light sources are used to utilize light beams having different wavelengths. Therefore, when the mold and the workpiece are continuously changed in a direction perpendicular to a working surface, it is difficult to align the mold and the workpiece.

On the other hand, the prior art method of aligning the mask with the wafer as disclosed in U.S. Pat. No. 6,529,625 is useful in the case where the alignment is performed with a specific gap, such as the case using a light exposure machine.

However, in the case of a nanoimprint apparatus, the distance between a mold and a workpiece which are opposed to each other continuously changes, so it is required to align the mold and the workpiece with respect to an arbitrary gap.

Such a requirement occurs, for example, when a resin is interposed between the mold and the workpiece. That is, before and after the mold becomes in contact with the resin or when pressurization is performed in a state in which the resin is applied, a position shift between the mold and the workpiece easily occurs.

When the position shift is large, the alignment takes a long time.

Therefore, when the distance between the mold and the workpiece is to be continuously changed, a structure capable of performing high-precision alignment in a short time is required.

SUMMARY OF THE INVENTION

The present invention has been made in view of the above-mentioned problems. An object of the present invention is to provide an imprint apparatus capable of performing high-precision alignment when the distance between a mold and a workpiece changes and an alignment method for the imprint apparatus.

In order to solve the problems, an imprint apparatus having the following structure and an alignment method for the imprint apparatus are provided.

According to the present invention, there is provided an imprint apparatus including: a first holder for holding a mold having an imprint pattern; a second holder arranged in opposition to the mold for holding a workpiece to which the imprint pattern is transferred; a first illumination system for irradiating a mark for determining a position of the mold and a mark for determining a position of the workpiece with light;

a first optical system for imaging the mark for determining the position of the mold at a first observation point by using the light from the first illumination system; a second optical system for imaging the mark for determining the position of the workpiece at a second observation point; an imaging optical system that belongs to both the first optical system and the second optical system; a first image pick-up device for observing the mark for determining the position of the mold which is imaged at the first observation point; a second image pick-up device for observing the mark for determining the position of the workpiece which is imaged at the second observation point; and at least one drive mechanism of a first drive mechanism for moving the first image pick-up device while following movement of the first observation point which is caused by a change in distance between the mold and the imaging optical system; and a second drive mechanism for moving the second image pick-up device while following movement of the second observation point which is caused by a change in distance between the workpiece and the imaging optical system.

Further, according to the present invention, there is provided an alignment method for an imprint apparatus including: imaging a mark for determining a position of a mold having an imprint pattern at a first observation point to observe the imaged mark by using a first image pick-up device; imaging a mark for determining a position of a workpiece to which the imprint pattern is transferred at a second observation point to observe the imaged mark by using a second image pick-up device; and performing one of an operation of moving the first image pick-up device while following movement of the first observation point which is caused by a change in position of the mold and an operation of moving the second image pick-up device while following movement of the second observation point which is caused by a change in position of the workpiece.

In addition, according to the present invention, an imprint apparatus for transferring a pattern formed on a working surface of a mold which is a first object to a member to be worked which is a second object includes: an observation unit for imaging a mark provided on the working surface of the first object and a mark provided to the second object at a first observation point and a second observation point through an optical system to observe the imaged marks; and a drive mechanism for causing at least one of the first observation point and the second observation point while following movement of imaging positions of the marks which is caused by movement of at least one of the mold and the member to be worked in a direction normal to the working surface.

In addition, according to the present invention, an imprint method includes transferring a pattern formed on a working surface of a mold which is a first object to a member to be worked which is a second object, wherein upon imaging a mark provided on the working surface of the first object and a mark provided to the second object at a first observation point and a second observation point through an optical system to observe the imaged marks, and at least one of the first observation point and the second observation point is caused to follow movement of imaging positions of the marks which is caused by movement of at least one of the mold and the member to be worked in a direction normal to the working surface.

According to the present invention, it is possible to provide an imprint apparatus capable of performing high-precision alignment when a distance between the mold and the workpiece changes and an alignment method for imprint apparatus.

Further features of the present invention will become apparent from the following description of exemplary embodiments with reference to the attached drawings.

BRIEF DESCRIPTION OF THE DRAWINGS

FIGS. 7A, 7B, 7C, 7D, 7E and 7F are explanatory views illustrating imaging states of alignment marks according to Embodiment 3 of the present invention, in which FIG. 7A illustrates an image on a first image pick-up device, FIG. 7B illustrates an image on a second image pick-up device, FIG. 7C illustrates an image on the first image pick-up device in the case where a workpiece and a mold is within a focus area, FIG. 7D is the 7D-7D cross sectional view of the first image pick-up device, FIG. 7E is the 7E-7E cross sectional view of the second image pick-up device, and FIG. 7F is the 7F-7F cross sectional view of the first image pick-up device.

DESCRIPTION OF THE EMBODIMENTS

Figure 1:
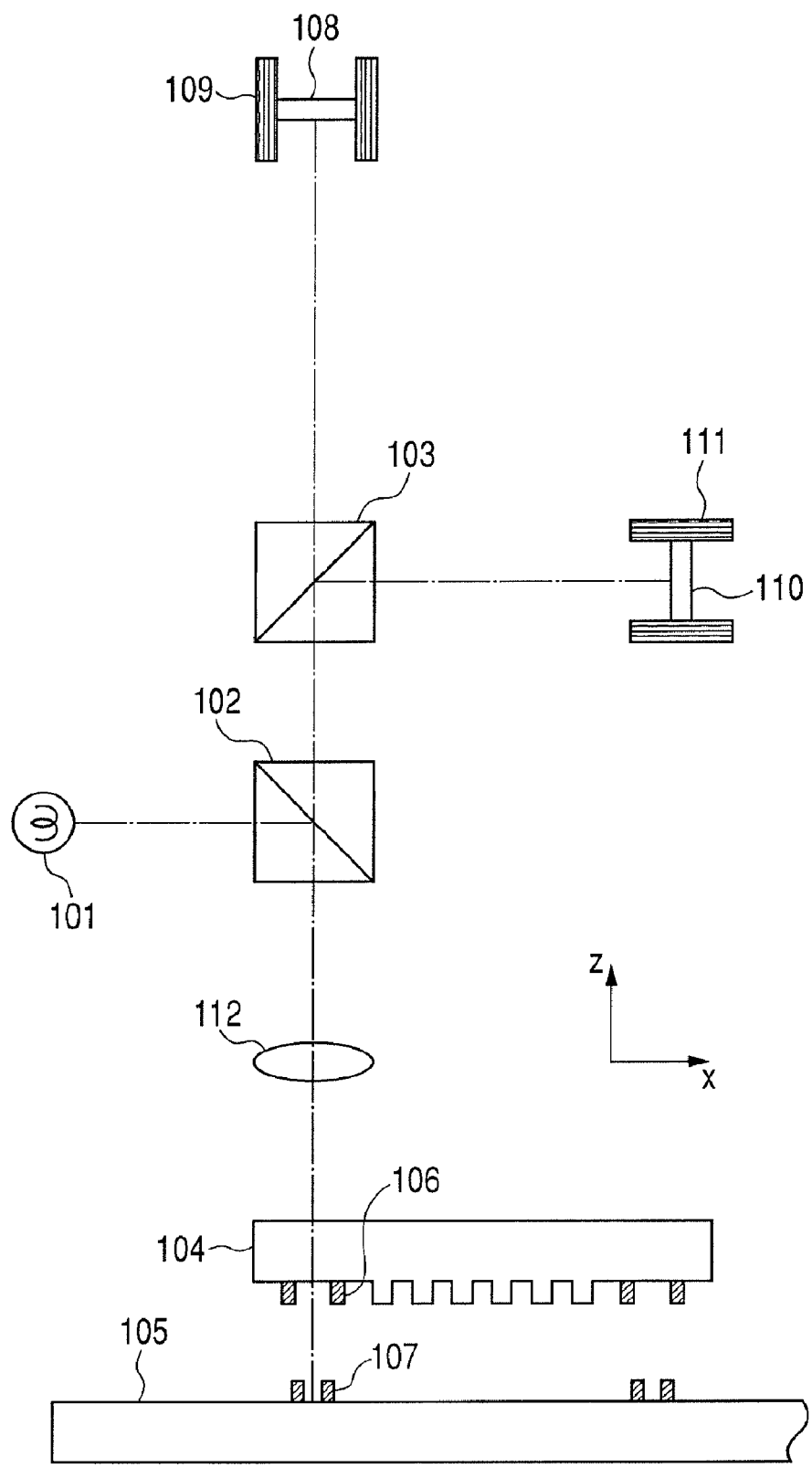
FIG. 1 is an explanatory diagram illustrating an optical system used for an imprint apparatus according to Embodiment 1 of the present invention.

An imprint apparatus according to the present invention includes a first holder for holding a mold and a second holder for holding a workpiece to which an imprint pattern is transferred. Examples of the workpiece to which the imprint pattern is transferred include a workpiece to which the imprint pattern is directly transferred and a workpiece to which a pattern is transferred by etching a resin to which the pattern is formed.

The imprint apparatus includes a first illumination system for irradiating a mark for determining a position of the mold and a mark for determining a position of the workpiece with light.

The mark for determining the position of the mold may be provided on the mold or provided to the first holder for holding the mold. The mark for determining the position of the workpiece may be provided on the workpiece or provided to the second holder for holding the workpiece.

The mark for determining the position of the mold and the mark for determining the position of the workpiece may be irradiated with light from the same light source or irradiated with light from separate light sources.

The imprint apparatus includes a first optical system for imaging the mark for determining the position of the mold at a first observation point by using the light from the first illumination system and a second optical system for imaging the mark for determining the position of the workpiece at a second observation point.

The imprint apparatus includes an imaging optical system that belongs to both the first optical system and the second optical system. The imaging optical system is, for example, an objective lens.

The imprint apparatus includes a first image pick-up device for observing the mark for determining the position of the mold which is imaged at the first observation point and a second image pick-up device for observing the mark for determining the position of the workpiece which is imaged at the second observation point. The observation point is a location capable of observing the mark. The observation point is desirably a location at which focusing is achieved.

The imprint apparatus includes at least one of a first drive mechanism for moving the first image pick-up device and a second drive mechanism for moving the second image pick-up device. The first drive mechanism is a mechanism for moving the first image pick-up device while following movement of the first observation point which is caused by a change in distance between the mold and the imaging optical system. The second drive mechanism is a mechanism for moving the second image pick-up device while following movement of the second observation point which is caused by a change in distance between the workpiece and the imaging optical system.

Another imprint apparatus according to the present invention includes a third object to which a mold reference mark corresponding to the mark for determining the position of the mold is provided and a fourth object to which a workpiece reference mark corresponding to the mark for determining the position of the workpiece is provided.

The imprint apparatus includes a second illumination system having the mold reference mark and the workpiece reference mark. The second illumination system may be the first illumination system. That is, the illumination system for irradiating the marks for determining the positions of the mold and the workpiece with light (first illumination system) may be used as an illumination system used for the mold reference mark and the workpiece reference mark (second illumination system).

The imprint apparatus includes at least one of a third drive mechanism for moving the third object while following the movement of the first observation point which is caused by the change in distance between the mold and the workpiece and a fourth drive mechanism for moving the fourth object while following the movement of the second observation point.

Hereinafter, embodiments of the present invention will be described.

Embodiment 1

In Embodiment 1, an optical system used for an imprint apparatus to which the present invention is applied will be described. FIG. 1 is an explanatory view illustrating the optical system of Embodiment 1.

In FIG. 1, the optical system includes a light source 101, a first beam splitter 102, and a second beam splitter 103.

A mold 104 has an imprint pattern. A workpiece 105 is opposed to the mold 104.

In this specification, the mold 104 may be referred to as a first object and the workpiece 105 may be referred to as a second object. The workpiece 105 may be also referred to as a member to be worked because the imprint pattern of the mold is transferred thereto.

A Mold mark 106 is arranged to the mold 104. A Workpiece mark 107 is arranged to the workpiece 105. The mold mark 106 and the workpiece mark 107 may be provided on the surfaces of the mold 104 and the workpiece 105 or embedded therein.

A first drive mechanism 109 for moving a first image pick-up device 108 is provided to the first image pick-up device 108. A second drive mechanism 111 for moving a second image pick-up device 110 is provided to the second image pick-up device 110. The optical system further includes a first imaging optical system 112.

The optical system in this embodiment can be constructed such that the mold mark 106 and the workpiece mark 107 can be substantially coaxially observed.

As illustrated in FIG. 1, the coordinate system is such that the direction perpendicular to a working surface of the mold 104 is set as a z-axis.

In the optical system in this embodiment, light emitted from the light source 101 reaches the mold 104 and the workpiece 105 through the first beam splitter 102 and the first imaging optical system 112.

The light from the light source 101 is guided to the mold mark 106. Light reflected on the mold mark 106 passes through the first imaging optical system 112 and the first beam splitter 102 and then is imaged onto the first image pick-up device 108 through the second beam splitter 103. Herein, an optical system including the light source 101 and the first beam splitter 102 is set as a first illumination system. Although not shown, the first illumination system includes optical elements such as lenses. The first illumination system as well as the first imaging optical system 112 constitute a Koehler illumination system. An optical system for imaging the light from the mold onto the first image pick-up device 108 is set as a first optical system. The location at which an image of the mold mark 106 is formed is set as a first observation point.

Light reflected on the mark of the workpiece passes through the first imaging optical system 112 and the first beam splitter 102 and then is imaged onto the second image pick-up device 110 by the second beam splitter 103. An optical system for imaging the light from the workpiece onto the second image pick-up device 110 is set as a second optical system. The location at which an image of the workpiece mark 107 is formed is set as a second observation point.

The mold mark 106 of the mold 104 being the first object is observed using the first image pick-up device 108. When the mold 104 moves in the Z-direction to change the distance between the mold 104 and the first imaging optical system 112, the imaging position of the mold mark 106 also moves. Therefore, the first image pick-up device 108 is moved by the first drive mechanism 109 so as to follow the movement of the first observation point corresponding to the imaging position.

The workpiece mark 107 of the workpiece 105 being the second object is observed using the second image pick-up device 110. When the workpiece 105 moves in the Z-direction to change the distance between the workpiece 105 and the first imaging optical system 112, the imaging position of the workpiece mark 107 also moves. Therefore, the second image pick-up device 110 is moved by the second drive mechanism 111 so as to follow the movement of the second observation point corresponding to the imaging position.

Because the optical system in this embodiment has the above-mentioned structure, when the workpiece 105 is brought close to the mold 104 or when the mold 104 is brought close to the workpiece 105, the imaging position can be continuously observed. As a result, the positions of the mold and the workpiece can be corrected every time when the distance therebetween changes.

Herein, a method of following the imaging position corresponding to the movement of the mold or the workpiece will be described.

Figure 2:
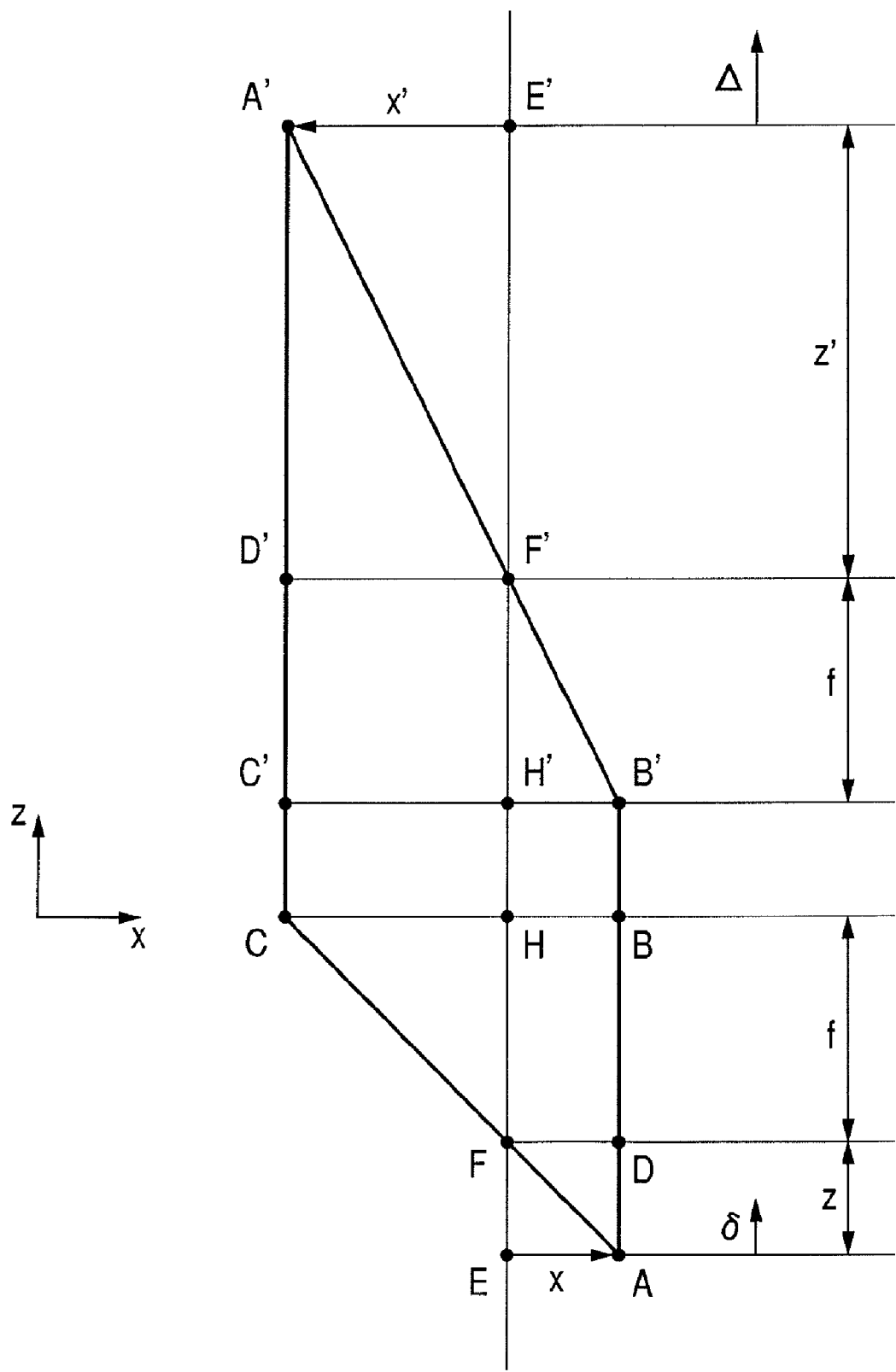
FIG. 2 is a schematic explanatory diagram illustrating a method of causing the optical system of FIG. 1 to follow an imaging position corresponding to movement of each of a mold and a workpiece according to Embodiment 1 of the present invention.

FIG. 2 is a schematic diagram illustrating the optical system of FIG. 1 in this embodiment.

FIG. 2 illustrates a state in which light exited from a point "A" of an object EA is imaged to a point A' of an image E'A'. Note that an object side indicates a mold or workpiece side and an image side indicates an image pick-up device side. Assume that an optical axis of the optical system is expressed by EE', an object-side focus point of the optical system is expressed by F, an object-side principal point of the optical system is expressed by H, an image-side focus point of the optical system is expressed by F', and an image-side principal point of the optical system is expressed by H'.

In this case, because of the nature of light, a light beam traveling from the point "A" to the focus point F passes through a point C on a line crossing the object-side principal point. After that, the light beam travels parallel to the optical axis and intersects a point C' on a line crossing the image-side principal point. Then, the light beam travels parallel to the optical axis.

A light beam traveling parallel to the optical axis from the point "A" located on the object side passes through a point B on the line crossing the object-side principal point. The light beam is refracted at a point B' on the line crossing the image-side principal point and passes through the image-side focus point F'.

The point A' at which the light beams intersect with each other corresponds to the imaging point. In this case, $\triangle ADF$ and $\triangle FHC$ have a similar relationship and $\triangle B'H'F'$ and $\triangle F'D'A'$ have a similar relationship.

Therefore, the optical magnification M is expressed by the following expression.

$$M = \frac{FH}{AD} = \frac{f}{z} = \frac{F'E'}{H'F'} = \frac{z'}{f} \quad (1)$$

The following longitudinal magnification formula is obtained from the expression. As illustrated in FIG. 2, the origin of an object side distance z corresponds to the object-side focus point and the origin of an image-side distance z' corresponds to the image-side focus point.

$$z' = M^2 z \quad (2)$$

Thus, when an object-side position is shifted in the z-direction by $\delta$, an imaging position corresponding thereto is shifted by $\Delta$ as expressed by the following expression (3).

$$\Delta = M^2 \delta \quad (3)$$

That is, when the image pick-up device is moved by a distance obtained by multiplying a shifted distance between one of the mold 104 and the workpiece 105 and the first imaging optical system 112 by the square of the magnification of the first imaging optical system 112, an image whose focus is sharp can be obtained.

For example, assume that the optical magnification M is equal to 10, the mold is located at a distance of 10 mm from the object-side focus point, and the workpiece is located at a distance of 100 μm from the mold.

With such a state, the imaging position of the mold is located at a distance of 1000 mm from the object-side focus point and the imaging position of the workpiece is located at a distance of 1010 mm from the object-side focus point.

When the workpiece is moved to a position located at a distance of 10 μm from the mold, the imaging position of the workpiece is located at a distance of 1001 mm from the object-side focus point.

In the optical system including the first image pick-up device and the second image pick-up device, there is a case where the respective center positions of the image pick-up devices are shifted from the optical axis. In this case, a relative position between the image pick-up devices is unknown.

Therefore, when the mold is to be aligned with the workpiece, it is necessary to measure a relative positional relationship between the first image pick-up device and the second image pick-up device in advance. Assume that a positional error between the first image pick-up device and the second image pick-up device is a 0th error.

In a method of measuring the 0th error, the first and second image pick-up devices are placed by the drive mechanisms at positions at which the mark provided on the surface of the mold is imaged onto the first and second image pick-up devices.

The center position of the mold mark on the first image pick-up device and the center position of the mold mark on the second image pick-up device are calculated. Therefore, the relative position between the first and second image pick-up devices can be measured.

For another method of measuring the 0th error between the first image pick-up device and the second image pick-up device, a reference workpiece having a predetermined pattern depth can be used.

According to this method, the reference workpiece is moved upward and downward by a workpiece lifting mechanism having sufficient precision to image the mark onto each of the first image pick-up device and the second image pick-up device.

When two images obtained by the first and second image pick-up devices are compared with each other, the relative position between the first and second image pick-up devices can be measured, so the 0th error between the first and second image pick-up devices can be corrected.

Actual alignment will be described. Assume that the difference between the center of the first image pick-up device and the center of the mold mark is a first error and the difference between the center of the second image pick-up device and the center of the workpiece mark is a second error. A third error between the mold and the workpiece is calculated based on the 0th error, the first error, and the second error. The mold and the workpiece are adjusted such that the third error becomes a desirable value. Then, the alignment between the mold and the workpiece is completed.

In this embodiment, the alignment can be performed using a mark such as a box, a cross, a bar, or a combination of those.

Although not taken into account in calculating the imaging positions, when the distance between one of the workpiece and the mold and the imaging optical system changes, the magnification M also changes. The magnification M is expressed by the following expression (4).

$$M = \frac{f}{z - \delta} \quad (4)$$

When an error of the magnification becomes a problem, a mark having a symmetrical structure can be used as an alignment mark.

For example, there is a box-in-box method using a workpiece mark of a square and a mold mark of a square smaller than the workpiece mark.

In this method, the alignment is performed such that distances from respective sides of the large square and the small square become equal to one another. Alternatively, the alignment is performed such that the center position of the large square is aligned with the center position of the small square.

When the magnification is to be corrected, correction may be performed by image processing based on a z-position using the expression (4) or a method of multiplying a numeral value obtained after the image processing by a correction coefficient may be employed. For example, when the magnification becomes larger by a change in distance, data in which the number of pixels for image processing on the image pick-up device is increased is used. When the magnification is to be more finely corrected, data interpolation may be performed between pixels to further add data whose size is equal to or smaller than a pixel size, thereby performing the correction.

Further, when the magnification is to be corrected, a magnification-variable optical component may be provided as described later in Embodiment 2.

The expressions (1) to (4) are satisfied in an ideal state. When the optical system is complicated, there may arise a shift from an actual value. In such a case, the first drive mechanism and the second drive mechanism may be controlled based on one of a more detailed optical simulation value and an actual measured value.

Figure 3:
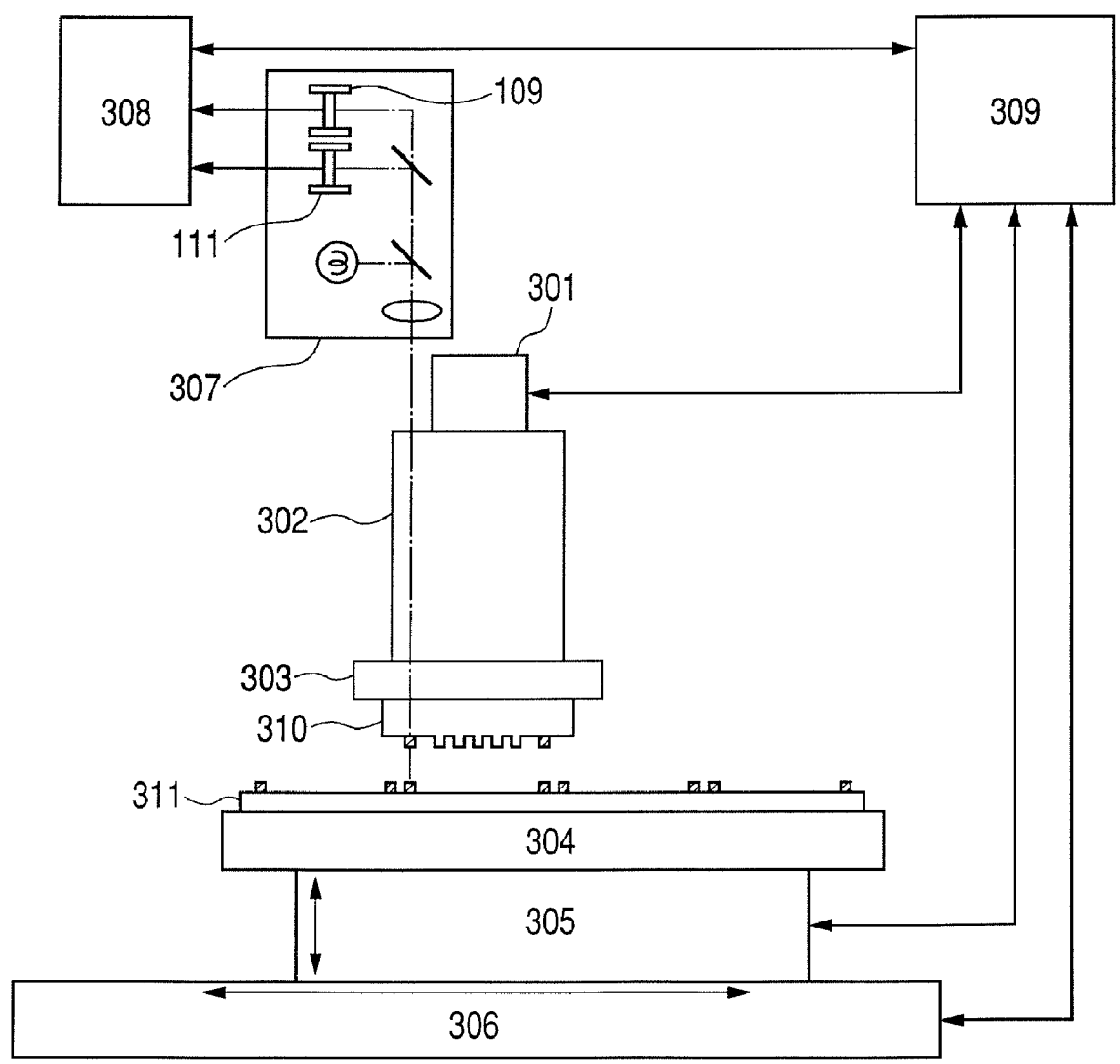
FIG. 3 is an explanatory diagram illustrating the imprint apparatus according to Embodiment 1 of the present invention.

FIG. 3 illustrates a structural example of the imprint apparatus according to this embodiment.

In FIG. 3, the imprint apparatus includes an exposure light source 301, a lens barrel 302, a mold holder (first holder) 303 for holding a mold 310, a workpiece holder (second holder) 304 for holding a workpiece 311, a workpiece lifting mechanism (z) 305, and an in-plane moving mechanism (xy θ) 306. The imprint apparatus further includes an optical system 307 as illustrated in FIG. 1 and an analysis mechanism 308. The mold holder 303 chucks the mold 310 by vacuum chucking.

In the imprint apparatus according to this embodiment, the workpiece can be moved to a desirable position by the in-plane moving mechanism. In addition, the workpiece can be adjusted in height by the workpiece lifting mechanism and pressurized thereby.

In the in-plane moving mechanism and the workpiece lifting mechanism, distance measurement is conducted by an interferometer or the like. The measurement precision is desirably in the order of one-tenth of a target alignment precision. In this case, subnanometer precision is employed.

The positional movement of the workpiece, the pressurization thereto, and the exposure thereto are controlled by an imprint control mechanism 309. Although not shown in this embodiment, a resin is applied to the workpiece. Examples of the applying method include a spin coating method and an ink-jet method using a dispenser.

Next, a working method in this embodiment will be described.

Figure 4:
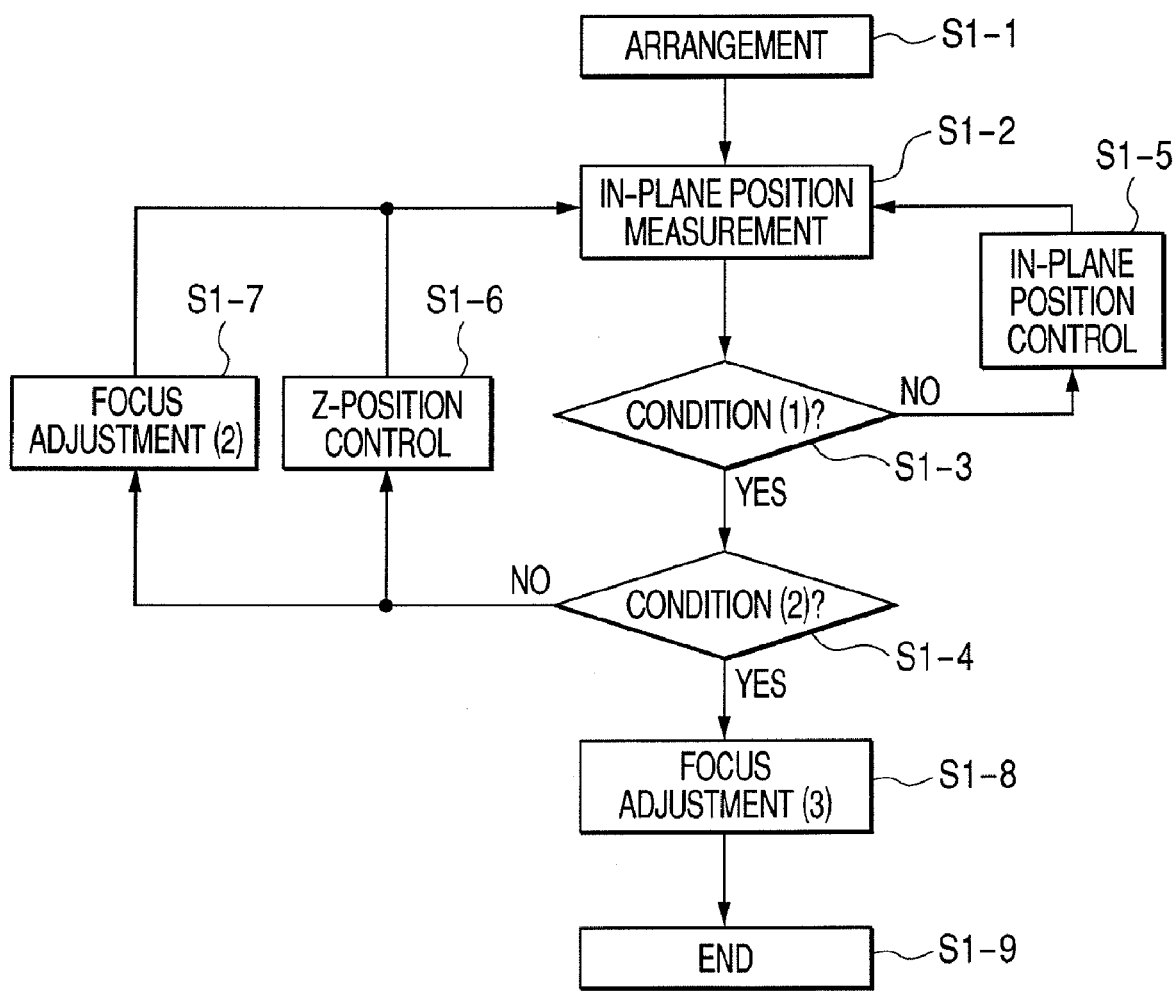
FIG. 4 is an explanatory flowchart illustrating a mold-workpiece alignment sequence according to Embodiment 1 of the present invention.

FIG. 4 is an explanatory flowchart illustrating a mold-workpiece alignment sequence in this embodiment.

The case where the workpiece is moved in the z-direction by the workpiece lifting mechanism will be described herein.

In this case, it is unnecessary to operate the first drive mechanism used for observing the mold mark.

According to the working method in this embodiment, in Step S1-1, the workpiece is moved in an in-plane direction and arrangement at a position opposing to the mold.

Then, in Step S1-2, in-plane position measurement is performed on the mold and the workpiece.

Then, in Step S1-3, whether or not an error obtained by the in-plane position measurement falls within a reference range is determined.

When the error does not fall within the reference range, it goes to in-plane position control of Step S1-5. When the error falls within the reference range, whether or not a condition (2) of Step S1-4 is satisfied is determined.

With respect to the condition (2), for example, it is determined whether or not the height of the workpiece is set such that a gap formed between the mold and the workpiece becomes a desirable gap.

When the condition (2) is not satisfied, it goes to Steps S1-6 and S1-7.

In Step S1-6, the workpiece is brought closer to the mold by a set distance by z-position control.

In Step S1-7, the image pick-up devices are moved by the drive mechanisms to positions at which the mold mark and the workpiece mark are imaged.

The distance at this time is derived from, for example, the expression (2). Such an operation is repeated until the height of the workpiece becomes a desirable value.

When the condition (2) is satisfied, in Step S1-8, the image pick-up devices are moved to original positions by the drive mechanisms and an alignment process for aligning the mold with the workpiece is completed. For example, an exposure process follows the alignment process.

As described above, in the alignment method according to Embodiment 1 of the present invention, the alignment marks which are separately provided on the workpiece having a flat shape and the mold having the imprint pattern are picked up using the respective corresponding image pick-up devices. The alignment in the in-plane direction between the workpiece and the mold which are opposed to each other is performed based on information from the image pick-up devices. The image pick-up devices are moved so as to follow the movement of observation points of the alignment marks which is caused by a change in interval between the workpiece and the mold. Then, the alignment between the workpiece and the mold is performed based on information from the moved image pick-up devices.

The interval between the workpiece and the mold can be changed while the position control in the in-plane direction is performed on the workpiece and the mold.

Embodiment 2

In Embodiment 2, an optical system capable of adjusting a magnification used for the imprint apparatus will be described.

Figure 5:
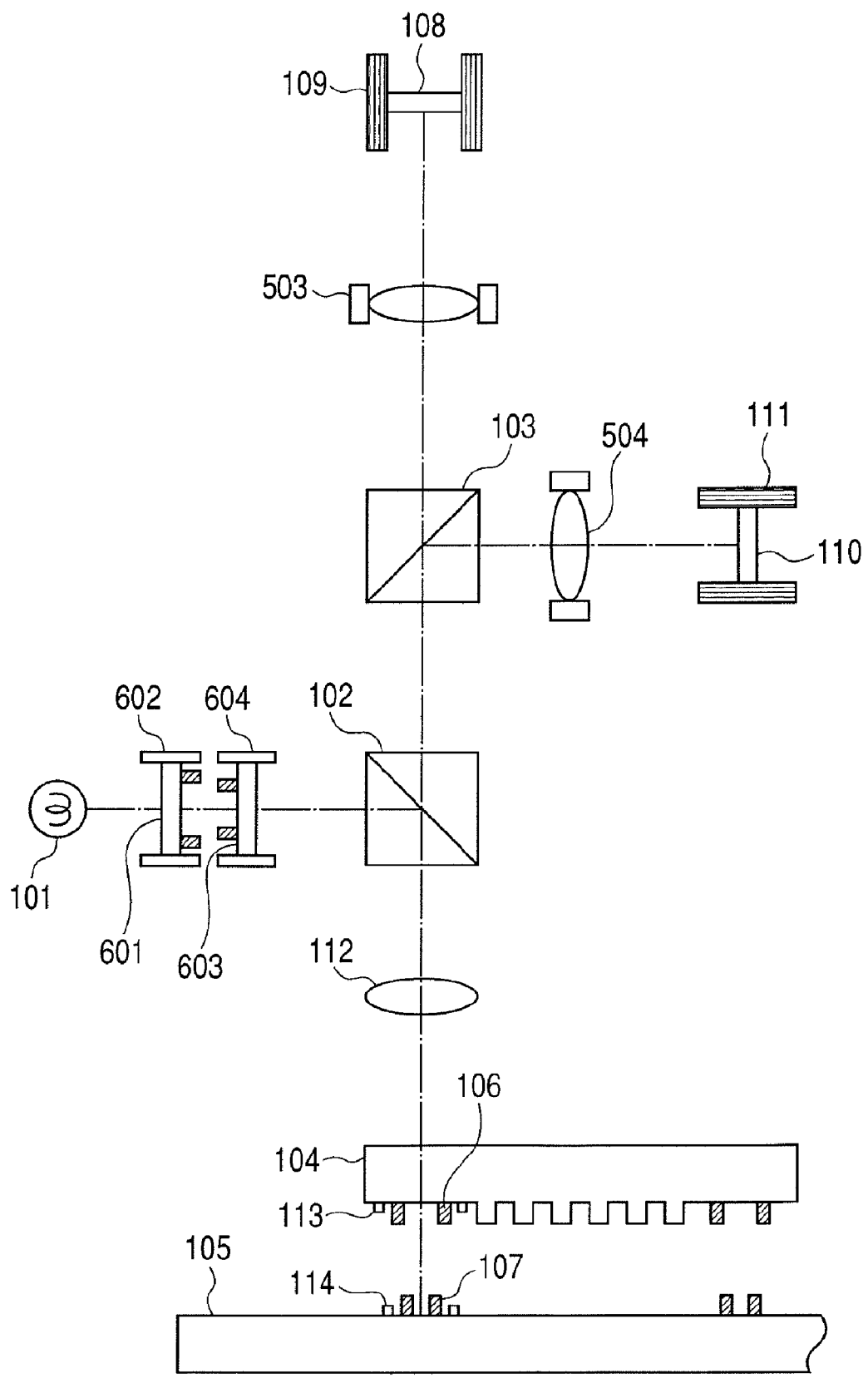
FIG. 5 is an explanatory diagram illustrating a magnification-variable optical system used for an imprint apparatus according to Embodiment 2 of the present invention.

FIG. 5 is an explanatory diagram illustrating the optical system in this embodiment.

In FIG. 5, the same constituent elements as those of Embodiment 1 as illustrated in FIG. 1 are expressed by the same reference numerals and thus the description of common portions are omitted.

As illustrated in FIG. 5, reference numeral 501 denotes a first magnification-variable optical component and reference numeral 502 denotes a second magnification-variable optical component.

The optical system in this embodiment includes the first magnification-variable optical component 501 for adjusting imaging magnification for the first image pick-up device 108 and the second magnification-variable optical component 502 for adjusting imaging magnification for the second image pick-up device 110.

To be specific, the first magnification-variable optical component 501 is disposed between the second beam splitter and the first image pick-up device and the second magnification-variable optical component 502 is disposed between the second beam splitter and the second image pick-up device.

This optical system is constructed such that the magnifications is adjusted by zoom lenses to continuously hold constant imaging positions. Therefore, constant magnifications can be continuously held regardless of the changes in positions of the mold and workpiece in the z-direction. When the imaging positions are changed by zooming, the positions of the image pick-up devices are adjusted based on the changed imaging positions.

Embodiment 3

In Embodiment 3, an optical system including a mold reference mark and a workpiece reference mark, which is used for the imprint apparatus, will be described.

Figure 6:
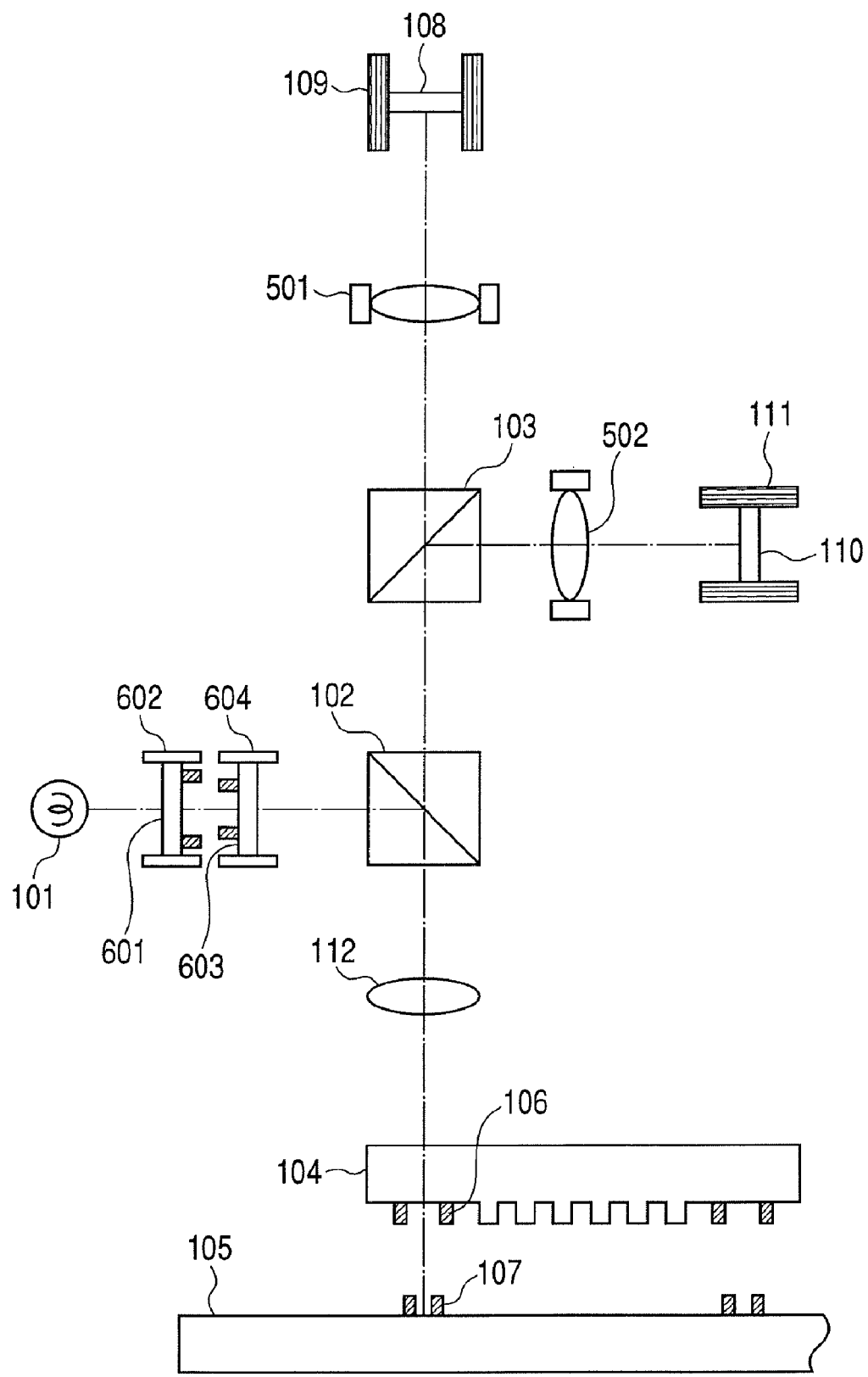
FIG. 6 is an explanatory diagram illustrating an optical system including a mold reference mark and a workpiece reference mark, which is used for an imprint apparatus according to Embodiment 3 of the present invention.

FIG. 6 is an explanatory diagram illustrating the optical system in this embodiment.

In FIG. 6, the same constituent elements as those of Embodiments 1 and 2 as illustrated in FIGS. 1 and 5 are expressed by the same reference numerals and thus the description of common portions are omitted.

In FIG. 6, the optical system includes a mold reference mark member (third object) 601 in which a reference mark is provided, a mold reference mark member drive mechanism (third drive mechanism) 602, a workpiece reference mark member (fourth object) 603 in which a reference mark is provided, and a workpiece reference mark member drive mechanism (fourth drive mechanism) 604.

In Embodiment 3, each of the first image pick-up device and the second image pickup device is shifted from the optical axis, so the mold reference alignment mark and the workpiece reference alignment mark are used for the optical system, thereby performing the alignment.

In this embodiment, one of the optical system as described in Embodiment 1 and the optical system capable of correcting the magnification as described in Embodiment 2 can be used as the optical system for imaging.

In an optical system of an illumination system (second illumination system) used for the mold reference mark and the workpiece reference mark, the mold reference mark member 601 and the workpiece reference mark member 603 are disposed between the light source 101 and the first beam splitter 102. In this case, the second illumination system is identical to the first illumination system described in Embodiment 1.

The mold reference mark and the workpiece reference mark can be adjusted in position by the mold reference mark member drive mechanism 602 and the workpiece reference mark member drive mechanism 604, respectively.

In this embodiment, an optical system for adjusting the magnification may be further inserted between the workpiece reference mark member 603 and the first beam splitter 102.

The mold reference mark member 601 is controlled so as to follow the movement of the mold 104. As a result, the mold reference mark member 601 is imaged to the mold 104 through the first beam splitter 102 and the first imaging optical system 112. The mold mark 106 and a mold reference mark 113 imaged to the mold are imaged onto the first image pick-up device 108 through the first imaging optical system 112, the first beam splitter 102, the second beam splitter 103, and the first magnification-variable optical component 501. Similarly, the workpiece reference mark member 603 is controlled so as to follow the movement of the workpiece 105.

The workpiece mark 107 and a workpiece reference mark 114 imaged to the workpiece are imaged onto the second image pick-up device 110.

According to the following method in this case, the movement satisfies, for example, the expression (2).

When the in-plane relative position relationship between the reference mark of the mold reference mark member 601 and the reference mark of the workpiece reference mark member 603 is measured in advance, the mold 104 and the workpiece 105 can be relatively aligned with each other.

In such a structural example, the mold reference mark member 601 and the workpiece reference mark member 603 are imaged to the mold 104 and the workpiece 105, respectively, and then imaged onto the first image pick-up device 108 and the second image pick-up device 110, respectively.

In another structure, another optical system for imaging the mold reference mark member 601 and the workpiece reference mark member 603 to the mold 104 and the workpiece 105 may be provided. That is, the second illumination system may be different from the first illumination system. For example, in FIG. 5, another light source can be disposed on the right side of the first beam splitter 102, and then a mold reference mark member, a mold reference mark member drive mechanism, a workpiece reference mark member, and a workpiece reference mark member drive mechanism can be further disposed. Even in such a structure, the workpiece reference mark and mold reference mark can be directly imaged onto the first image pick-up device and the second image pick-up device, respectively.

Figure 7A:
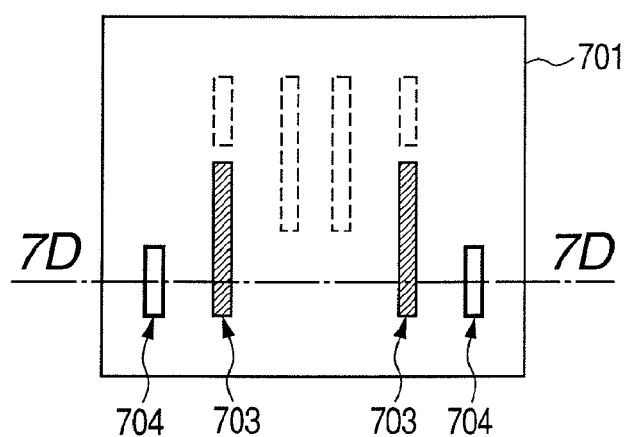
Figure 7D:
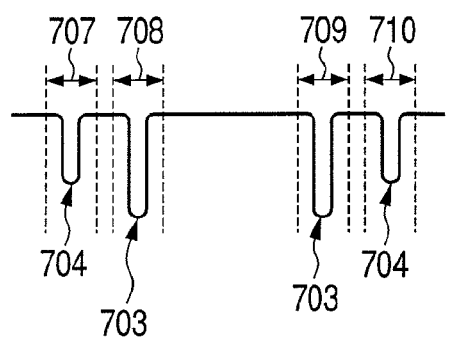
Figure 7B:
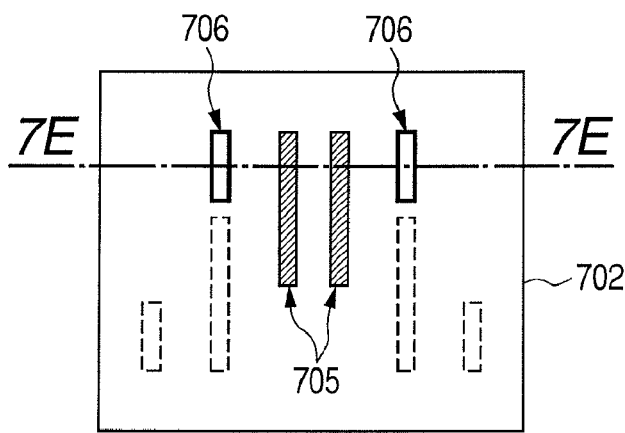
Figure 7E:
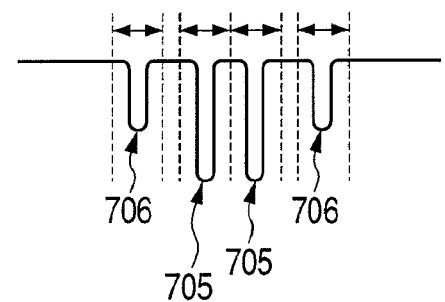

FIGS. 7A to 7F illustrate an image 701 of the first image pick-up device and an image 702 of the second image pick-up device. FIG. 7A illustrates an image of the mold taken under a condition where the mold and the workpiece are sufficiently separated from each other. This illustrates a state in which a mold mark 703 and a mold reference mark 704 are imaged. Broken lines indicate the workpiece mark and the workpiece reference mark which blur because of being out of focus. FIG. 7B illustrates an image on the second image pick-up device under the condition where the mold and the workpiece are separated from each other at a sufficient interval as in FIG. 7A. This illustrates a state in which a workpiece mark 705 and a workpiece reference mark 706 are imaged. FIG. 7D is the 7D-7D cross sectional view of FIG. 7A. FIG. 7E is the 7E-7E cross sectional view of FIG. 7B. The mold reference mark, the mold mark, the workpiece reference mark, and the workpiece mark are desirably designed so as not to be overlapped with one another when the marks are viewed from a longitudinal direction. When measurement is performed in not only the X-direction but also the Y-direction, the marks are rotated by 90 degrees are disposed.

Signal processing for alignment will be described with reference to FIG. 7D. Image data is stored in a one-dimensional array of a[0] to a[999] (the case where 1000 pixels are used). The array is divided into an outer region-1 707, an outer region-2 710, an inner region-1 708, and an inner region-2 709. The outer reigon-1 is comprised of elements a[out1_st] to a[out1_end]. The outer reigon-2 is comprised of elements a[out2_st] to a[out2_end]. The inner reigon-1 is comprised of elements a[in1_st] to a[in1_end]. The inner reigon-2 is comprised of elements a[in2_st] to a[in2_end].

Indexes indicating the elements of the array have the following relationship.

The outer reigon-1 is equal in length to the outer reigon-2.

$$out2\_end - out2\_st = out1\_end - out1\_st = p$$

(out1_st<out1_end, out2_st<out2_end)

The inner reigon-1 is equal in length to the inner reigon-2.

in2_end−in2_st=in1_end−in1_st=q (in1_st<in1_end, in2_st<in2_end)

The region interval between the outer reigon-1 and the outer reigon-2 does not change.

out2_end−out1_end=out2_st−out1_st=m

The region interval between the inner reigon-1 and the inner reigon-2 does not change.

in2_end−in1_end=in2_st−in1_st=n

Each of p, q, m, and n is a constant. Therefore, out1_st and in1_st each are a variable.

Herein, s and t are defined as follows:

$$s = \sum_{i=0}^{p} (a[\text{out2\_end} - i] - a[\text{out1\_st} + i])^2$$

$$= \sum_{i=0}^{p} (a[\text{out1\_st} + p + m - i] - a[\text{out1\_st} + i])^2$$

$$t = \sum_{j=0}^{q} (a[\text{in2\_end} - j] - a[\text{in1\_st} + j])^2$$

$$= \sum_{j=0}^{q} (a[\text{in1\_st} + q + n - j] - a[\text{in1\_st} + j])^2$$

While "out1_st" and "in1_st" are changed, s and t, each of which becomes minimum, are obtained.

Assume that "out1_st" and "in1_st" in the case where s and t become minimum are expressed by u and v, respectively. At this time, (2u+p+m)/2 indicates the center of the mold mark and (2v+q+n)/2 indicates the center of the mold reference mark. The value of each of s and t is a discrete value because each of u and v is an integer. Fitting may be performed using previous and subsequent values of u and v to calculate values after the decimal point. Assume that the difference between the center of the mold reference mark and the center of the mold mark is a first error.

The same calculation is performed for the workpiece mark and the workpiece reference mark. Assume that the difference between the center of the workpiece reference mark and the center of the workpiece mark is a second error.

When the optical system includes a mold reference mark member and a workpiece reference mark member, a 0th error is assumed to be the difference between the center of the mold reference mark and the center of the workpiece reference mark. Assume that the difference between the mold and workpiece with respect to a desirable position is a third error. The third error is calculated based on the first error and the second error in view of the 0th error. The mold and the workpiece are adjusted in position such that the third error becomes a desirable value. Then, the alignment is completed.

Figure 7C:
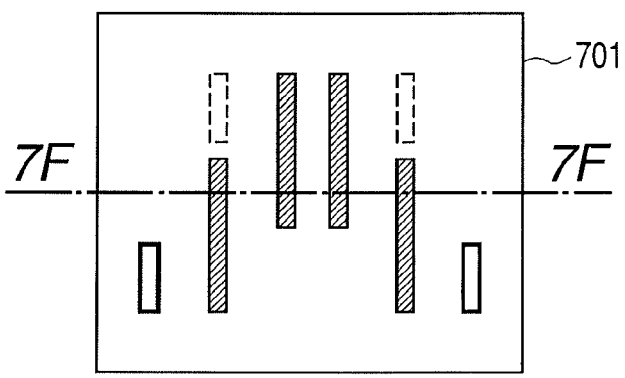
Figure 7F:
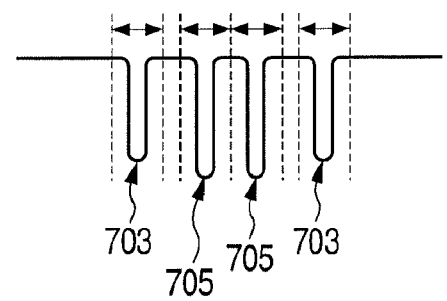

FIG. 7C illustrates an image 701 on the first image pick-up device in the case where an interval between the mold and the workpiece becomes smaller and thus the mold and workpiece are located within a focus depth of the first optical system. FIG. 7F is the 7F-7F cross sectional view of FIG. 7C. In such a case, the third error can be directly calculated using the mold mark 703 and the workpiece mark 705. That is, the position of the mark for determining the position of the mold which is imaged onto the first image pick-up device and the position of the mark for determining the position of the workpiece which is imaged onto the first image pick-up device are compared with each other for alignment. This alignment has the following advantage. Because the calculation is performed without using the mold reference mark and the workpiece reference mark, the error becomes smaller, so there is a case where precision measurement can be performed.

The imprint apparatus including the optical system described in each of the embodiments can be used for a semiconductor manufacturing technique and an apparatus for manufacturing an optical device such as a photonic crystal and a biochip such as a μ-TAS.

The alignment method used for an imprint apparatus for transferring a mold pattern to a workpiece is mainly described. The present invention can be applied to an alignment method for the case where the distance between two opposed objects changes. That is, the present invention can be applied to an alignment method of aligning a first object with a second object. For example, there is an alignment method for a bonding apparatus for bonding a workpiece to another workpiece. A first object and a second object can be aligned with each other using a first object reference mark and a second object reference mark.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-257713 filed Sep. 22, 2006 and 2007-206093 filed Aug. 8, 2007, which are hereby incorporated by reference herein in their entirety.

What is claimed is:

1. An imprint apparatus, comprising:
   a first holder for holding a mold having an imprint pattern;
   a second holder arranged in opposition to the mold for holding a workpiece to which the imprint pattern is transferred;
   a first illumination system for irradiating a mark for determining a position of the mold and a mark for determining a position of the workpiece with light;
   a first optical system for imaging the mark for determining the position of the mold at a first observation point by using the light from the first illumination system;
   a second optical system for imaging the mark for determining the position of the workpiece at a second observation point;
   an imaging optical system that belongs to both the first optical system and the second optical system;
   a first image pick-up device for observing the mark for determining the position of the mold which is imaged at the first observation point;
   a second image pick-up device for observing the mark for determining the position of the workpiece which is imaged at the second observation point; and
   at least one drive mechanism of a first drive mechanism for moving the first image pick-up device while following movement of the first observation point which is caused by a change in distance between the mold and the imaging optical system and a second drive mechanism for moving the second image pick-up device while following movement of the second observation point which is caused by a change in distance between the workpiece and the imaging optical system.

2. An imprint apparatus according to claim 1, comprising the first drive mechanism and the second drive mechanism.

3. An imprint apparatus according to claim 1, wherein the first drive mechanism moves the first image pick-up device by a distance obtained by multiplying a changed distance between the mold and the imaging optical system by a square of a magnification of the imaging optical system.

4. An imprint apparatus according to claim 1, wherein the second drive mechanism moves the second image pick-up device by a distance obtained by multiplying a changed distance between the workpiece and the imaging optical system by a square of a magnification of the imaging optical system.

5. An imprint apparatus according to claim 1, further comprising a correction unit for correcting a change in magnification which is caused by a change in distance between one of the mold and the workpiece and the imaging optical system.

6. An imprint apparatus according to claim 5, wherein the correction unit comprises a magnification-variable optical component provided in one of the first optical system and the second optical system.

7. An imprint apparatus according to claim 1, wherein the mark for determining the position of the mold is provided to the mold.

8. An imprint apparatus according to claim 1, wherein the mark for determining the position of the workpiece is provided to the workpiece.

9. An imprint apparatus according to claim 1, further comprising:
    a second illumination system including:
    a third object to which a mold reference mark corresponding to the mark for determining the position of the mold is provided; and
    a fourth object to which a workpiece reference mark corresponding to the mark for determining the position of the workpiece is provided; and
    at least one drive mechanism of a third drive mechanism for moving the third object while following the movement of the first observation point which is caused by the change in distance between the mold and the imaging optical system and a fourth drive mechanism for moving the fourth object while following the movement of the second observation point which is caused by the change in distance between the workpiece and the imaging optical system.

10. An imprint apparatus according to claim 9, comprising the third drive mechanism and the fourth drive mechanism.

11. An imprint apparatus according to claim 9, wherein the second illumination system is the first illumination system.

12. An alignment method for an imprint apparatus, comprising:
    imaging a mark for determining a position of a mold having an imprint pattern at a first observation point to observe the imaged mark by using a first image pick-up device;
    imaging a mark for determining a position of a workpiece to which the imprint pattern is transferred at a second observation point to observe the imaged mark by using a second image pick-up device; and
    performing one of an operation of moving the first image pick-up device while following movement of the first observation point which is caused by a change in position of the mold and an operation of moving the second image pick-up device while following movement of the second observation point which is caused by a change in position of the workpiece.

13. An alignment method according to claim 12, wherein the first image pick-up device is moved by a distance obtained by multiplying a changed distance between the mold and an imaging optical system included in an optical system for imaging at the first observation point and the second observation point by a square of a magnification of the imaging optical system.

14. An alignment method according to claim 12, wherein the second image pick-up device is moved by a distance obtained by multiplying a changed distance between the workpiece and an imaging optical system included in an optical system for imaging at the first observation point and the second observation point by a square of a magnification of the imaging optical system.

15. An alignment method according to claim 12, further comprising correcting a change in magnification which is caused by a change in position of one of the mold and the workpiece.

16. An alignment method according to claim 12, further comprising:
    imaging a mold reference mark corresponding to the mark for determining the position of the mold at the first observation point to observe the mold reference mark by using the first image pick-up device;
    imaging a workpiece reference mark corresponding to the mark for determining the position of the workpiece at the second observation point to observe the workpiece reference mark by using the second image pick-up device; and
    performing one of an operation of moving the mold reference mark while following the movement of the first observation point which is caused by the change in position of the mold and an operation of moving the workpiece reference mark while following the movement of the second observation point which is caused by the change in position of the workpiece.

17. An alignment method according to claim 12, further comprising comparing a position of the mark for determining the position of the mold, imaged to the first image pick-up device, with a position of the mark for determining the position of the workpiece.

18. An alignment method of aligning a first object with a second object, comprising:
    imaging a mark for determining a position of the first object at a first observation point to observe the imaged mark by using a first image pick-up device;
    imaging a mark for determining a position of a second object at a second observation point to observe the imaged mark by using a second image pick-up device; and
    performing one of an operation of moving the first image pick-up device while following movement of the first observation point which is caused by a change in position of the first object and an operation of moving the second image pick-up device while following movement of the second observation point which is caused by a change in position of the second object.

19. An alignment method according to claim 18, further comprising:
    imaging a first object reference mark corresponding to the mark for determining the position of the first object at the first observation point to observe the first object reference mark by using the first image pick-up device;
    imaging a second object reference mark corresponding to the mark for determining the position of the second object at the second observation point to observe the second object reference mark by using the second image pick-up device; and
    performing one of an operation of moving the first object reference mark while following the movement of the first observation point which is caused by the change in position of the first object and an operation of moving the second object reference mark while following the movement of the second observation point which is caused by the change in position of the second object.

20. An alignment method of imaging alignment marks separately provided to a workpiece having a flat shape and to a mold having an imprint pattern by using respective corresponding image pick-up devices and aligning the workpiece and the mold which are opposed to each other in an in-plane direction based on information from the image pick-up devices, comprising:

moving the image pick-up devices while following movement of observation points of the alignment marks which is caused by a change in interval formed between the workpiece and the mold; and aligning the workpiece with the mold based on information from the moved image pick-up devices.

21. An alignment method according to claim 20, wherein the interval formed between the workpiece and the mold is adjusted during in-plane position control on the workpiece and the mold.

* * * * *